United States Patent [19]
Olsson

[11] Patent Number: 4,538,117
[45] Date of Patent: Aug. 27, 1985

[54] TRANSISTOR AMPLIFIER

[76] Inventor: Bengt G. Olsson, Galärvägen 13, Saltsjö-Boo, Sweden, S-132 00

[21] Appl. No.: 483,955
[22] PCT Filed: Aug. 27, 1982
[86] PCT No.: PCT/SE82/00272
  § 371 Date: Apr. 6, 1983
  § 102(e) Date: Apr. 6, 1983
[87] PCT Pub. No.: WO83/00965
  PCT Pub. Date: Mar. 17, 1983

[30] Foreign Application Priority Data
Aug. 28, 1981 [SE]  Sweden .............................. 8105111

[51] Int. Cl.³ .............................................. H03F 3/16
[52] U.S. Cl. ..................................... 330/277; 330/298
[58] Field of Search .................... 330/151, 207 P, 277, 330/295, 296, 298

[56] References Cited
U.S. PATENT DOCUMENTS
3,557,092  5/1971  Kubicz .
4,072,908  2/1978  Murari et al. .
4,382,195  5/1983  Pohl et al. ........................ 330/298 X Primary Examiner—James B. Mullins
Attorney, Agent, or Firm—Birch, Stewart, Kolasch & Birch

[57] ABSTRACT

An amplifier comprising of two MOS-transistors $Q_1$ and $Q_2$ and a resistor $R_1$ connected as a two-pole between a DC power source, $PS_1$, and a load $Z_L$; in order to avoid harmful influences on the amplifier from the load current, and to obtain a simple control unit for this purpose:

(a) the emitters (sources) of $Q_1$ and $Q_2$ form one pole of the two-pole, and one side of $R_1$ is connected in series with the collector (drain) of $Q_1$, and the other side of $R_1$ together with the collector (drain) of $Q_2$ form the other pole of the two-pole, (b) the resistance of $R_1$ is of the same magnitude as $Z_L$, (c) a mainly constant-DC-voltage-generating network, $V_B$, is connected between the gates of $Q_1$ and $Q_2$, with a polarity causing $Q_2$ to conduct less than $Q_1$, and a voltage causing $Q_2$ not to conduct before $Q_1$ conducts or aims to conduct the full rated current, i.e. a current of the same magnitude as the output current, (d) the driver stage is connected to the gate of $Q_1$ or to the gate of $Q_2$ or at some other point in the constant-DC-voltage-generating network, $V_B$.

3 Claims, 5 Drawing Figures

TRANSISTOR AMPLIFIER

BACKGROUND OF THE INVENTION

This invention relates to methods for reducing the power dissipation in power transistors of the MOS=-Metal Oxide Semiconductor type. The invention is not applicable to transistors of non-insulated gate structure e.g. bipolar types.

The power transistor is used for the purpose of controlling the current in an external load. The transistor acts as a variable resistance, therefore the current flowing will inevitably cause a certain heat to be dissipated. This heat is detrimental to the junctions of transistors, causing a faster deterioration, finally leading to malfunction. In order to dissipate more power, the transistor has to be made physically larger, therefore more expensive.

Therefore, one attempts to reduce the power dissipation in power-transistor devices for example by using fastswitching circuits, but these are complicated and cause many disturbances. Alternatively the cooling has to be improved with heat-exchangers or the so called heat sinks and even with forced air cooling.

All of these disadvantages are overcome in a simple way by this invention. The principle—using a resistor to reduce the dissipation in the transistor, and "move" it to the resistor—is well known. But not until the invention of the MOS-transistor has the road been opened to carry out simple control and dividing arrangements for the transistor and resistor-current.

SUMMARY OF THE INVENTION

The invention is based on the principle that, through the insertion of a "threshold-voltage" between the gates of two transistors $Q_1$ and $Q_2$, $Q_1$ will always conduct full current while $Q_2$ can be controlled, linearly and continously. $Q_1$ can be controlled linearly and continously, if and when $Q_2$ is cut off. This is combined with the known technique: insertion of a resistance, $R_1$, in series with $Q_1$ which reduces the dissipation in $Q_1$. However, this result is a total resistance which is not lower than the value of $R_1$, unless $Q_2$ exists. When the device is to be used as a variable resistance the value of this resistance has to be decreased to zero ohms, which is performed by $Q_2$. Its dissipation is reduced by the fact that a substantial part of the total current flows through $Q_1$ and $R_1$, especially when the voltage across the device is high. When the voltage is low, the dissipation in $Q_2$ is low nevertheless.

This type of control, with a threshold voltage, is impossible to carry out with bipolar transistors, because the input base of $Q_1$ would comprise a short circuit for the threshold voltage, also termed "bias" from a "constant-DC-voltage-generating network".

For the overall definition of the invention, reference can be made to the appended claims.

BRIEF DESCRIPTION OF DRAWINGS

The modes of operation of this invention are illustrated in FIGS. 1-5.

DESCRIPTION OF PREFERRED EMBODIMENTS

Figure 1:
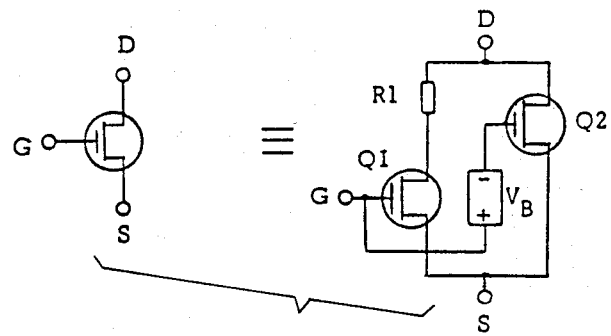
FIG. 1 shows the configuration of the circuit, which can be seen to have external terminations identical to that of a MOS transistor, which the said circuit replaces.

The principle of the circuit is shown in FIG. 1. It signifies that the transistor-function is divided between two transistors, $Q_1$ and $Q_2$, of which $Q_1$ is connected in series with a resistor, $R_1$. In addition there is a source of voltage, $V_B$, connected between the gates, having a polarity preventing $Q_2$ conducting before $Q_1$—to such an extent that $Q_2$ does not begin to conduct before $Q_1$ is conducting full current. The input control voltage may be applied to the gate of $Q_1$ or $Q_2$, to which being not important.

It may appear inconvenient to use four components instead of one, but the following points will define the reason behind this:

1. The components are of a basic type.
2. The reduction in the heat dissipation will be accomplished, theoretically by 75% and practically by between 65% and 70%.
3. The heat dissipation never occurs simultaneously in $Q_1$ and $Q_2$, therefore they may be mounted on the same heat sink.

Therefore heat dissipation is reduced to 166 -¼ by the addition of components costing only a fraction of the cost of the transistors.

The improvement is especially notable at AC and reactive loads. The mode of operation is too complex to describe here.

Figure 2:
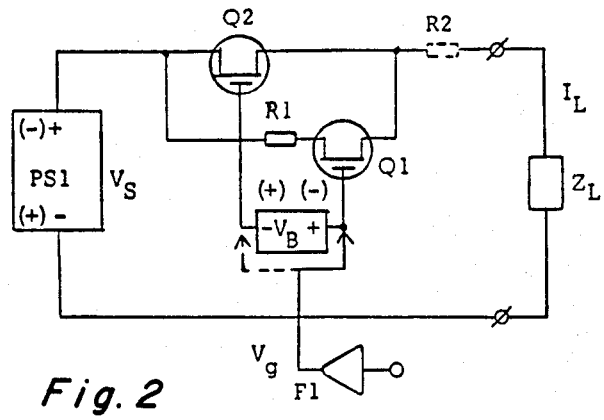
FIG. 2 shows its insertion in a practical circuit, which in addition contains a power supply ($PS_1$), a load ($Z_L$) and a driver amplifier ($F_1$).
Figure 3:
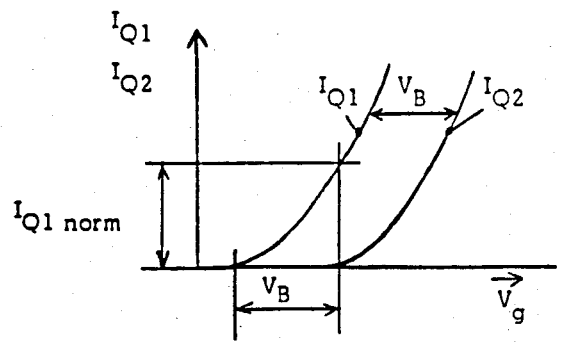
FIG. 3 shows the output current/input voltage characteristic.

The mode of operation is evident from FIG. 2 and FIG. 3. Suppose that the MOS-transistors are of the enchancement N-channel type. These are marketed under various brands, such as VMOS, SIPMOS etc. If the voltage $V_{GS}=0$ V they are cut-off, irregardless of the voltage D−S (as long as D is positive, which is the normal operating polarity of the N-channel type). If $V_{GS}$ is made positive, the current increases as the square of the voltage above a certain "cut-off" voltage. According to FIG. 2, $Q_1$ will conduct first. When the control-voltage $V_g$ has increased by the amount $V_B$, $Q_2$ will conduct the same amount of current. At that moment the current in $Q_1$ will have increased further and exceed the rated current of the transistor (I $Q_1$ norm.)

The resistor $R_1$ in series with $Q_1$ limits this current to a value which is lower than that which follows from FIG. 3. Further current may be conducted through $Q_2$, by an amount which is determined by the external impedance and the control voltage $V_g$.

According to this invention, the control device simply consists of:

(1) an input terminal connected to the gate of $Q_1$ or $Q_2$, (2) a source voltage, $V_B$, which is adjusted so that $Q_2$ conducts little or no current during the interval when $Q_1$ conducts a current of magnitude zerorated current, i.e. zero to a given current equal to the magnitude of the maximum output current. This source of voltage is defined in the appended claims as a "constant-DC-voltage-generating network".

The above relates to the current-handling of the transistors, which is not synonymous with their real current. The current in $Q_1$ may be limited by $R_1$ because the voltage across $Q_1$ decreases to a low value, close to zero. Under these circumstances any further increase of the current is accomplished by $Q_2$, if the control voltage, $V_g$, is further increased. With this invention it is possible to increase the control-voltage without having to supply power and for the voltage source having to be more than static, e.g. a charged capacitor.

Thus, the high input impedance of the MOS-transistor, is a necessary requirement for this invention.

Figure 4:
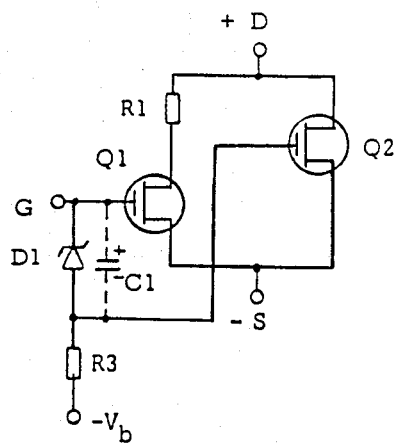
FIG. 4 shows the required bias circuit.

One configuration of the "constant-DC-voltage-generating network" is illustrated in FIG. 4, which shows a source voltage originating from $D_1$, $R_3$ and eventually from $C_1$. Through the resistor $R_3$, which may be a high resistance and therefore dooes not load the control voltage $V_g$, a voltage develops across the Zener-diode $D_1$. Because the gates of $Q_1$ and $Q_2$ are insulated, the gate of $Q_1$ can be made more positive— more than required to make $Q_1$ conduct full current, this not being possible with a bipolar transistor. The excess voltage is obtained without any load on $D_1$ or $C_1$, except for the load from $R_3$. The driving and over-driving is thus obtained without loss of power.

This invention makes it possible to construct amplifiers in modular form with various power ranges. The basic form may only include $Q_1$. Larger powers may be handled quite simply by the addition of $Q_2$ (mounted possibly on the same heat sink), $R_1$ and $D_1$, $R_3$ and $C_1$. In this case the power output could be 3–4 times higher.

The basic intention of this invention is to combine $Q_1$, $Q_2$ and $R_1$ in one, itself being one connection, together with the bias network or "constant-DC-voltage-generating network", $V_B$, so that the desired division of the current at different intervals takes place. The device becomes rather simple, as the gates of the transistors are insulated.

Because the DC-load on $V_B$ is zero, the voltage can be kept constant by the capacitor $C_1$, even during large voltage-swings that causes the voltage polarity on $R_3$ to be reversed. Only the average voltage across $R_3$ is important.

There are other ways, of course, to design the bias-source $V_B$. The diode $D_1$ may be substituted for a transistor or another non-linear device. The source may be self generating, i.e. the voltage obtained by means of impedances connected to zero potential via diodes. It may even be obtained by regular rectifier circuits, or by the use of dry cells, as it draws very little current. The possibilities are too numerous to be able to explain them all herein.

Figure 5:
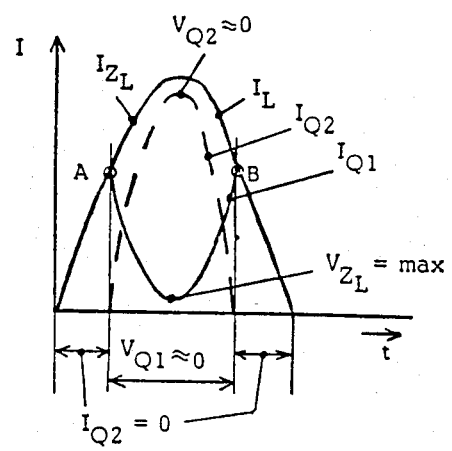
FIG. 5 shows the currents through the transistor during one half sine-wave cycle in the load resistor ($Z_L$) in FIG. 2.

In AC-amplifiers, two such circuits are used, as shown in FIG. 2, the part of the circuit to the left of the terminals connecting $Z_L$. The two circuits are connected to the same terminals, but they have opposite polarities (+instead of −) and have opposite types of channel structure transistors (N-channel instead of P-channel). Each circuit produces its own polarity of the output current. With sine-waved output current and a resistive load, $Z_L$, the currents of FIG. 5 are obtained, which explain the mode of operation in simple terms.

In the beginning the output current $I_L$ increases and becomes identical to the current of $Q_1$, because $Q_2$ is non-conducting. $Q_2$ does not start conducting until $Q_1$ is unable to deliver more current. The output voltage is made linear by a presumed existing negative feedback. At approximately ½ the rated current, point A (if $R_1 \approx Z_L$), the voltage across $Q_1$ becomes $\approx$ zero. The voltage from $PS_1$ divides equally across $R_1$ and $Z_L$. Further increase of the current through $Q_1$ is not possible. From the negative feedback (which is a prerequisite for the linearity, not for the function) is a request for more current $I_L$. The control voltage is then further increased and $Q_2$ begins to conduct (dashed line in FIG. 5). $Q_2$ sees an AC parallel connection of $R_1$ and $Z_L$, so its current grows twice as fast and becomes twice as large, as the current of $Q_1$, when the current of $Q_1$ decreases as the voltage across $R_1$ decreases.

It is evident that both $Q_1$ and $Q_2$ do not carry voltage and current at the same time. The maximum power dissipated in $Q_1$ is ¼ of the maximum power dissipated in $R_1$.

The power dissipated in $Q_2$ should be limited by some form of electronic current limiting. $R_2$ in FIG. 2 can be used to sense the output current. There are different possibilities for the limit characteristic. The principles of the current limiter are common in power amplifier design technique.

One great advantage of this invention is, that by limiting a constant (straight) current, limiting is possible without excessive power dissipation in the transistors. This current limiting also protects the transistors in the event of a short-circuit on the output ($Z_L = 0$). In the event of a short-circuit the voltage across $Q_1$ becomes zero. The total voltage originating from $PS_1$ develops across $R_1$ and at the same time the current in $Q_2$ becomes zero, providing the limiting current is suitable (equal to the maximum current through $R_1$). A short circuit does not cause any power loss in $Q_1$ or $Q_2$, only in $R_1$. In any case, a "straight" limiting current allows a reactive current equal to the maximum active current, which only causes a slight increase of dissipation in the transistor.

The advantages of this invention are particularly notable when used in conjunction with a reactive load. In this case the power dissipated in the transistors will be reduced, compared to that of an ordinary power amplifier.

The main area of application for this circuit is in power amplifiers or where a variable resistance is required e.g. in stabilized power supplies.

Only one design has been shown, but several possibilities exist to produce the constant-DC-voltage-generating network, $V_B$, especially when it is built into the driver stage. In the method described in these pages, only two transistors are used, while it is possible to use groups of transistors connected in parallel for higher power.

I claim:

1. An amplifier for connection as a two-pole device between a DC power source and a load impedance comprising:
   (a) first and second MOS-transistors of the same conductivity type, each having source, drain and gate terminals, the source terminals being commonly connected and forming one pole of said two-pole device, said one pole being connectable to said load impedance;
   (b) resistance means connected between the drains of the first and second MOS-transistors, said resistance means having substantially the same magnitude as said load impedance, said resistance means having a first end connected to the drain of said first MOS-transistor means and a second end connected to the drain of the second MOS-transistor to form the other pole of said two-pole device, said other pole being connectable to said DC power source;

(c) DC voltage generating means connected between the respective gates of said first and second MOS-transistors for applying a substantially constant voltage therebetween, the polarity of said constant voltage causing said second MOS-transistor to conduct less than said first MOS-transistor, the magnitude of said constant voltage precluding said second MOS-transistor from conducting until said first MOS-transistor conducts at the full rated current thereof; and (d) drive means connected in the gate circuits of said first and second MOS-transistors for applying a control voltage, causing said transistors to conduct.

2. The amplifier of claim 1, wherein said DC voltage generating means includes a Zener diode connected between the respective gate terminals, said Zener diode having a breakdown voltage of the same magnitude as the voltage required to drive the first MOS-transistor from zero to rated current.

3. The amplifier of claim 2, further including a current source connected to said Zener diode at the opposite gate terminal from the gate terminal to which said drive means applies said control voltage.

* * * * *